（12） United States Patent
Bailey et al.

(10) Patent No.: US 9,693,464 B2
(45) Date of Patent: Jun. 27, 2017

(54) MODULARLY-EXPANDABLE MINI-RACK SERVER SYSTEM

(71) Applicant: DELL, INC., Round Rock, TX (US)

(72) Inventors: Edmond Bailey, Cedar Park, TX (US); Joseph Andrew Vivio, Santa Rosa, CA (US)

(73) Assignee: Dell Products, L.P., Round Rock, TX (US)

( * ) Notice: Subject to any disclaimer, the term of this patent is extended or adjusted under 35 U.S.C. 154(b) by 598 days.

(21) Appl. No.: 14/139,839

(22) Filed: Dec. 23, 2013

(65) Prior Publication Data

US 2015/0181750 A1    Jun. 25, 2015

(51) Int. Cl.
*H05K 7/14* (2006.01)
*H05K 3/30* (2006.01)
*H05K 7/20* (2006.01)

(52) U.S. Cl.
CPC .......... *H05K 3/306* (2013.01); *H05K 7/1492* (2013.01); *H05K 7/1498* (2013.01); *H05K 7/20736* (2013.01); *H05K 7/20836* (2013.01); *Y10T 29/49126* (2015.01)

(58) Field of Classification Search
CPC .. H05K 7/20736; H05K 3/306; H05K 7/1498; H05K 7/20836; H05K 7/1492; Y10T 29/49126

USPC .......................... 361/679.46–679.48
See application file for complete search history.

(56) References Cited

U.S. PATENT DOCUMENTS

| | | | | |
|---|---|---|---|---|
| 8,203,828 | B2* | 6/2012 | Bornhorst et al. ............ | 361/601 |
| 9,019,707 | B2* | 4/2015 | Xu ....................... | H05K 7/1492 312/223.2 |
| 2004/0257766 | A1* | 12/2004 | Rasmussen ........ | H05K 7/20572 361/689 |
| 2013/0194726 | A1* | 8/2013 | Bailey et al. ................. | 361/637 |
| 2013/0198532 | A1* | 8/2013 | Bailey et al. ................. | 713/300 |

* cited by examiner

*Primary Examiner* — Bernard Rojas
(74) *Attorney, Agent, or Firm* — Isidore PLLC

(57) ABSTRACT

A rack apparatus includes a frame having (i) a power and cooling area and (ii) a block chassis forming one or more information technology (IT) bays that enable insertion of IT components. A plurality of IT components are contained within a component cabinet inserted in the block chassis. When operational, enable the rack apparatus to function as one of an information handling system (IHS) and an extension of a modular, scalable/expandable rack-based IHS. A busbar physically located at a back of the block chassis within the power and cooling area and enables direct coupling to one of another busbar and a power source to supply power to the plurality of IT components from a power interface board. A block controller is contained in the block chassis and communicatively coupled to the other IT components. The block controller performs all localized, block level control for the rack apparatus.

24 Claims, 11 Drawing Sheets

MODULARLY-EXPANDABLE MINI-RACK SERVER SYSTEM

BACKGROUND

1. Technical Field

The present disclosure generally relates to an information handling system and in particular to a modular, expandable rack-based information handling system and design.

2. Description of the Related Art

As the value and use of information continue to increase, individuals and businesses seek additional ways to process and store information. One option available to users is information handling systems. An information handling system (IHS) generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Large scale information handling systems, as utilized within data centers, are often designed in a rack configuration, having one or more servers and/or banks of storage physically located within a single rack chassis. The number of servers and thus the computing power that can be placed in these rack chassis is limited by the maximum height of the rack chassis. A large number of the conventional rack chassis are built to conform to a specific industry height, which is based in part on the desire of the various manufacturers to be able to move the racks through a minimum door size of a data center facility or to fit vertically upright within a facility having a minimum vertical clearance. Thus, for uniformity, most racks are built to a standard height to accommodate use in the lowest ceiling heights in which the racks are deployed. However, in many applications, the vertical heights of the doorway at the data center can be much lower than the ceiling height of the actual data center. Customers who desire larger computing capabilities than is provided within a single rack are forced to purchase two such racks and fit them within the allocated space, often side-by-side. These racks are individual computing systems that then have to be physically configured for use with each other. Conversely, customers who only desire a smaller number of servers within some sort of rack chassis structure are forced to purchase and full height rack chassis and fill only some of the bays with servers, leaving the remainder of the chassis empty.

BRIEF SUMMARY

Disclosed are a rack apparatus, an information handling system (IHS), and a method for enabling the rack apparatus to function as one of an IHS and an extension of a modular, scalable and expandable (MSE) rack-based IHS. According to at least one aspect of the present disclosure, a rack apparatus includes a frame having (i) a power and cooling area and (ii) a block chassis forming one or more IT bays that enable insertion of IT components. A plurality of IT components is contained within a component cabinet inserted in the block chassis. When operational, the plurality of IT components enables the rack apparatus to function as one of (i) a self-contained IHS and (ii) an extension of a MSE rack-based IHS. A busbar is physically located at a back of the block chassis within the power and cooling area and enables direct coupling to one of another busbar and a power source to supply power to the plurality of IT components. A power interface board is contained in the block chassis and coupled to the busbar to supply power to the IT components contained in the component cabinet. A block controller is contained in the block chassis and communicatively coupled to the other IT components. The block controller performs all block level control for the rack apparatus. One or more physical supports at a bottom surface of the frame enable the rack apparatus to be physically placed on top of a modular, expandable IT rack.

According to at least one additional aspect of the present disclosure, an IHS includes a frame comprising (i) a power and cooling area and (ii) a block chassis forming one or more IT bays that enable insertion of IT components. A plurality of IT components is contained within a component cabinet inserted in the block chassis. A busbar is physically located at a back of the block chassis within the power and cooling area, directly coupled to one of another busbar and a power source to supply power to the plurality of IT components. A power interface board is contained in the block chassis and coupled to the busbar to supply power to the IT components contained in the component cabinet. A block controller is contained in the block chassis and communicatively coupled to the other IT components and which performs all block level control for the rack apparatus. One or more physical supports are located at a bottom surface of the frame that enable the rack apparatus to be physically placed on top of the modular, expandable IT rack.

According to another aspect of the present disclosure, a method includes assembling a frame comprising a power and cooling area and a block chassis forming one or more information technology (IT) bays that enable insertion of IT components; providing a plurality of IT components within a component cabinet inserted in the block chassis and which, when operational, enable the rack apparatus to function as one or more blocks of a plurality of blocks within a MSE rack-based IHS. The method further includes attaching a busbar within the power and cooling area, which is physically located at a back of the block chassis, wherein the busbar enables direct coupling to one of (a) another busbar and (b) a power source to supply power to the plurality of IT components. A power interface board, which is contained in the block chassis, is coupled to the busbar to supply power to the IT components contained in the component cabinet. One or more of the IT components have power connectors/conductors that are physically abutting to one of the busbar and the power interface board to receive electrical power. The method further includes communicatively coupling a block controller, which is contained in the block chassis and which performs all block level control for the rack assembly, to the other IT components; and providing one or more physical supports to a bottom surface of the frame that enable the rack apparatus to be physically placed on top of a modular, expandable IT rack.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

A rack-based information handling system (IHS) is designed to be advantageously modular and scalable in order to deploy blocks of processing nodes in accordance to the need of a stand-alone IHS or of a larger rack.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 1:
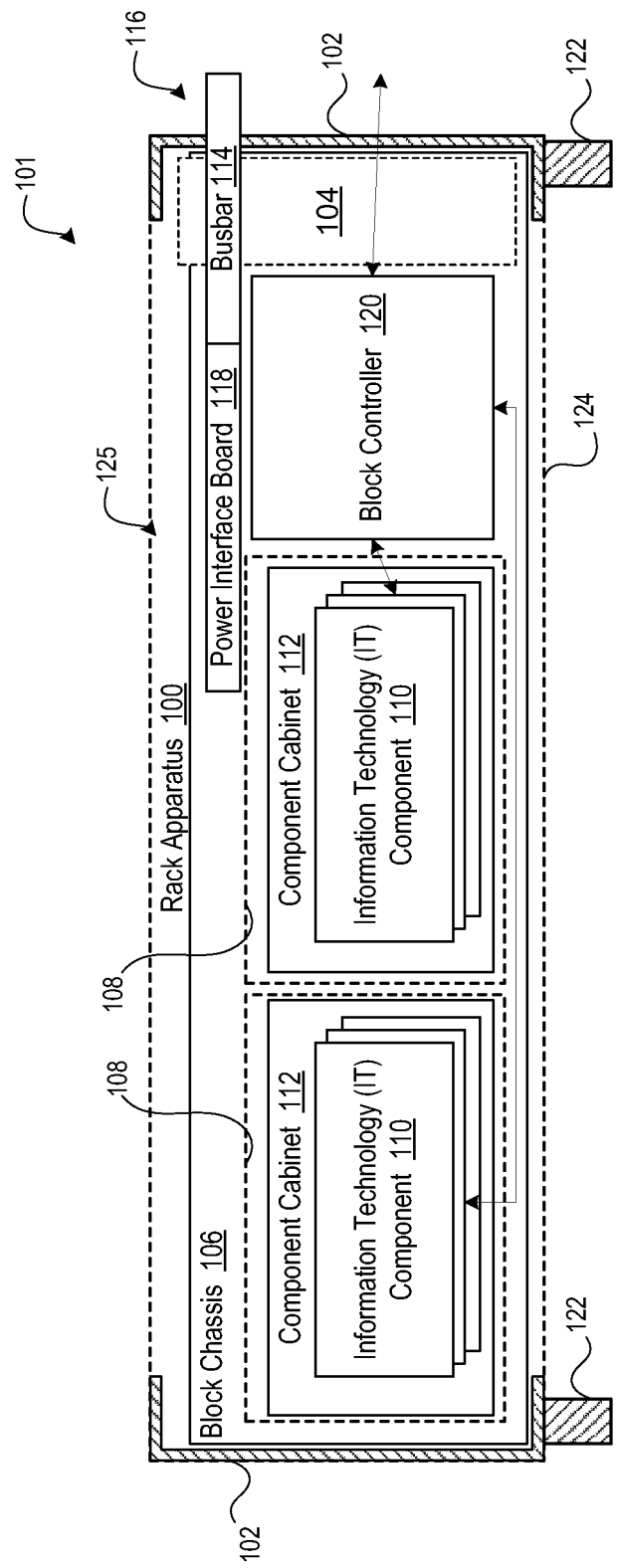
FIG. 1 illustrates a block diagram of a rack apparatus having a block controller that performs all localized, block level control for the rack apparatus, according to one or more embodiments.
Figure 7:
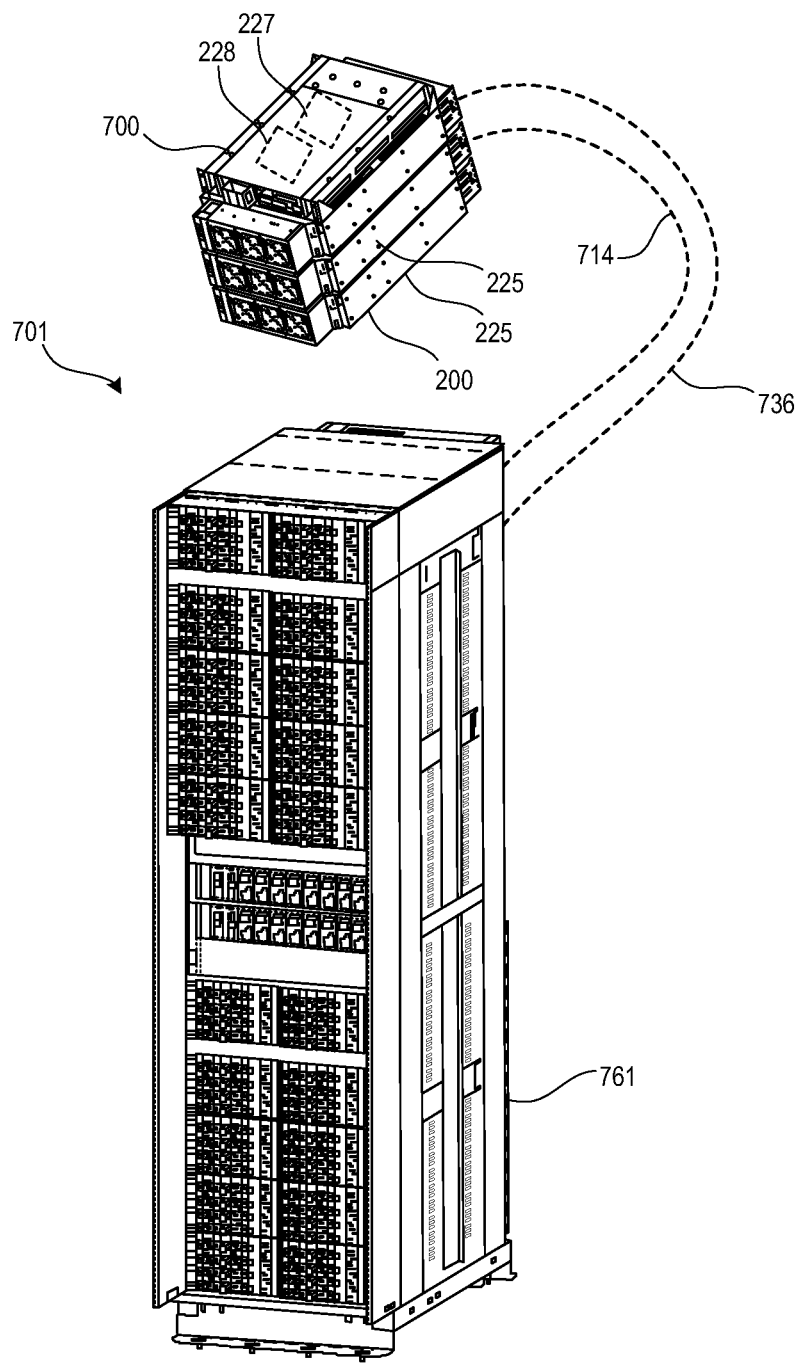
FIG. 7 illustrates a front isometric view of the rack apparatus of FIG. 3 detached from an IT rack.

In FIG. 1, a rack apparatus 100 is provided that can be utilized either to add multiple servers or Information Technology (IT) equipment on top of an existing IT apparatus or a stand-alone, modularly-expandable mini-rack system. The rack apparatus 100 includes a rack casing or frame 102 having (i) a power and cooling area 104 and (ii) a block chassis 106 forming one or more IT bays 108 that enable insertion of IT components. A plurality of IT components 110 are contained within component cabinets 112 inserted in the block chassis 106. When operational, the IT components 110 enable the rack apparatus 100 to function as one of an IHS 201 (FIG. 2) and an extension 300 (FIG. 3) of a modular, scalable/expandable (MSE) rack-based IHS 701 (FIG. 7). In one embodiment, the rack apparatus 100 is formed from an individual block 125.

A busbar 114 physically located at a back 116 of the block chassis 106 within the power and cooling area 104 enables direct coupling to one of another busbar 114 (FIG. 2) and a power subsystem 828 (FIG. 8) to supply power to the plurality of IT components 110. A power interface board 118 is contained in the block chassis 106 and coupled to the busbar 114 to supply power to the IT components 110 contained in the component cabinet 112. A block controller 120 is contained in the block chassis 106 and communicatively coupled to the other IT components 110 to perform all block level control for the rack apparatus 100. One or more physical supports 122 are provided at a bottom surface 124 of the frame 102 that enable the rack apparatus 100 to be physically placed on top of a modular, expandable IT rack 701 (FIG. 7). In at least one embodiment, the rack apparatus 100, including its functional components, performs as a fully independent IHS 101.

Figure 2:
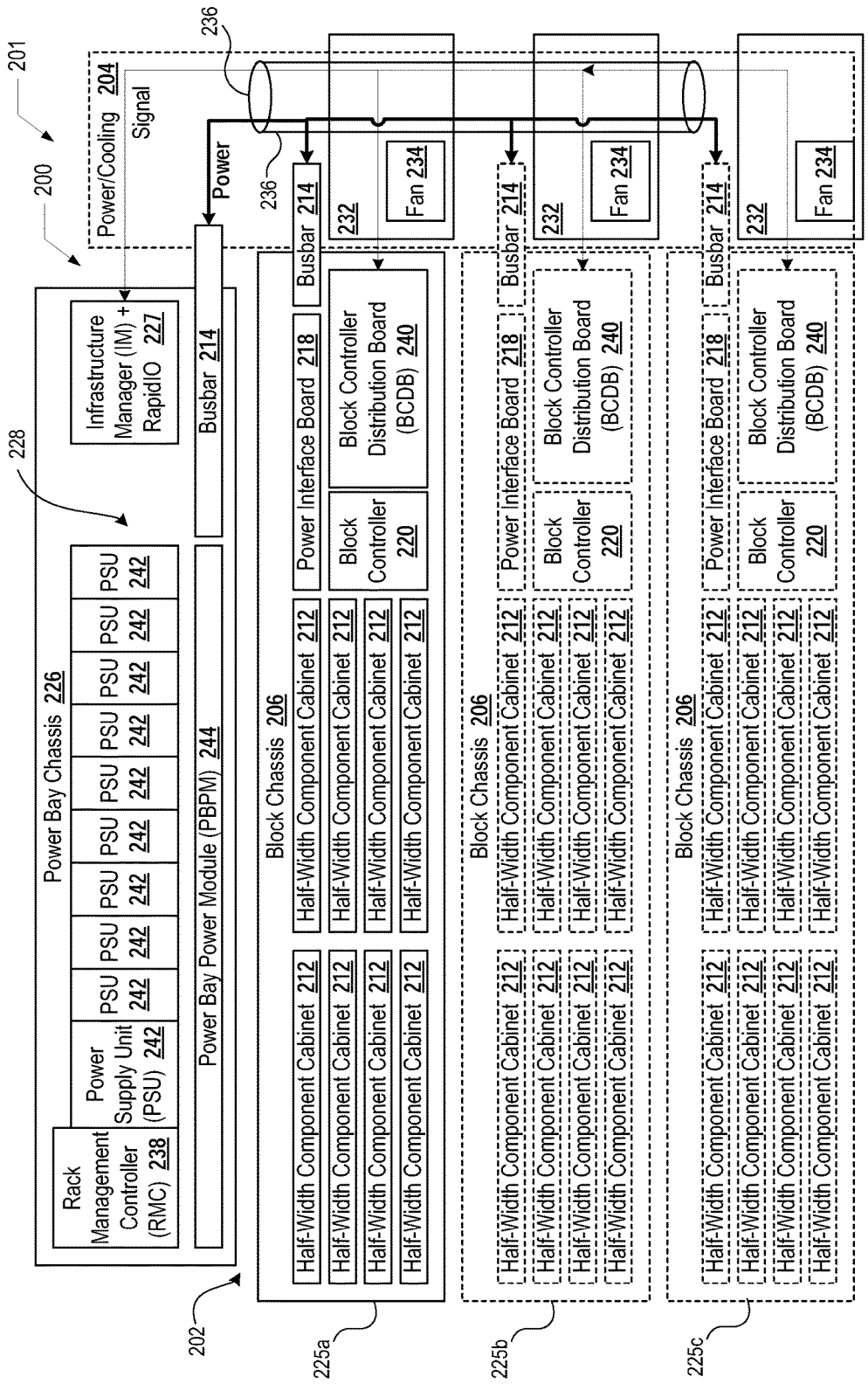
FIG. 2 illustrates a block diagram of an example rack apparatus configured as a standalone information handling system (IHS), according to one embodiment.

FIG. 2 provides another embodiment of a rack apparatus 200. Rack apparatus 200 has a rack casing or frame 202 of selectably more than one block chassis 206, which is functionally supported by a power bay chassis 226. Power bay chassis 226 contains an infrastructure manager (IM) 227 and a power subsystem 228. In one example, a plurality of IT components, such as contained in a half-width component cabinet 212 are included within rack apparatus 200. Each block chassis 206 and functional components contained therein can form a block 225. In the illustrative depiction, the rack apparatus 200 can be formed in part by a top block 225a, middle block 225b, and a bottom block 225c. When the rack apparatus 100 is included within a larger rack assembly, the plurality of IT components can be storage device nodes and/or computing device nodes. When the rack apparatus 200 is a stand-alone system, the plurality of IT components can be at least one computing device node. Each of the plurality of IT components has electrical power conductors that physically abut to one of a busbar 214 and the power interface board 218 to receive electrical power.

In one illustrative use, the rack-based 101 facilitates flexibly deploying processing capabilities. In particular, a height of a typical Information Technology (IT) rack can exceed the height restrictions found in some IT environments making it very difficult or impossible to deploy a full height rack. In addition, typical IT racks have a fixed height and payload capacity. In order for the end user to increase payload capacity, the rack must be removed and replaced with a taller rack or an additional rack added. This creates downtime, expense and requires additional floor space. The rack apparatus 100 of the present disclosure enables a deployment of a larger height system using at least two separate components, including the rack apparatus, and a larger rack chassis with blocks of processing nodes. The rack apparatus 100 is designed to be fixably attached atop the larger rack chassis to provide a vertically aligned series of processing blocks within a single rack that collectively operates as a single rack-based information handling system.

Returning to the FIG. 2 description, a fan bay module 232 is located within a power and cooling area 204. One or more fans 234 are inserted within the fan bay module 232. One or more communication cables 236 connect the one or more fans 234 to a block controller 220 to enable the block controller 220 to independently operate each of the one or more fans 234.

In one aspect, block controller 220 can include an Ethernet jack that enables the block controller 220 to be communicatively connected to a rack management controller (RMC) 238 of a larger rack assembly via an Ethernet cable to enable the RMC 238 to provide system level control for the rack apparatus 200 via communication with the block controller 220 when the rack apparatus 200 is integrated as a part of the larger rack assembly.

In one embodiment of the rack apparatus 200, the IM 227 in the power bay chassis 226 utilizes rapid input/output (RapidIO) and the block chassis 206 contains a block controller distribution board 240. The IM 227 communicates with the block controller 220 via RapidIO and the block controller distribution board 240 in order to perform rack management and enable block cooling of the plurality of IT components. The RMC 238 in the power bay chassis 226 is communicatively coupled to the block controller 220 to perform system level control. One or more power supply units (PSUs) 242 provide electrical power to a power module 244. Both the PSUs 242 and power module 244 are contained in the power bay chassis 226. The PSUs 242 are electrically coupled to the busbar 214 via the power bay power module 244.

Figure 3:
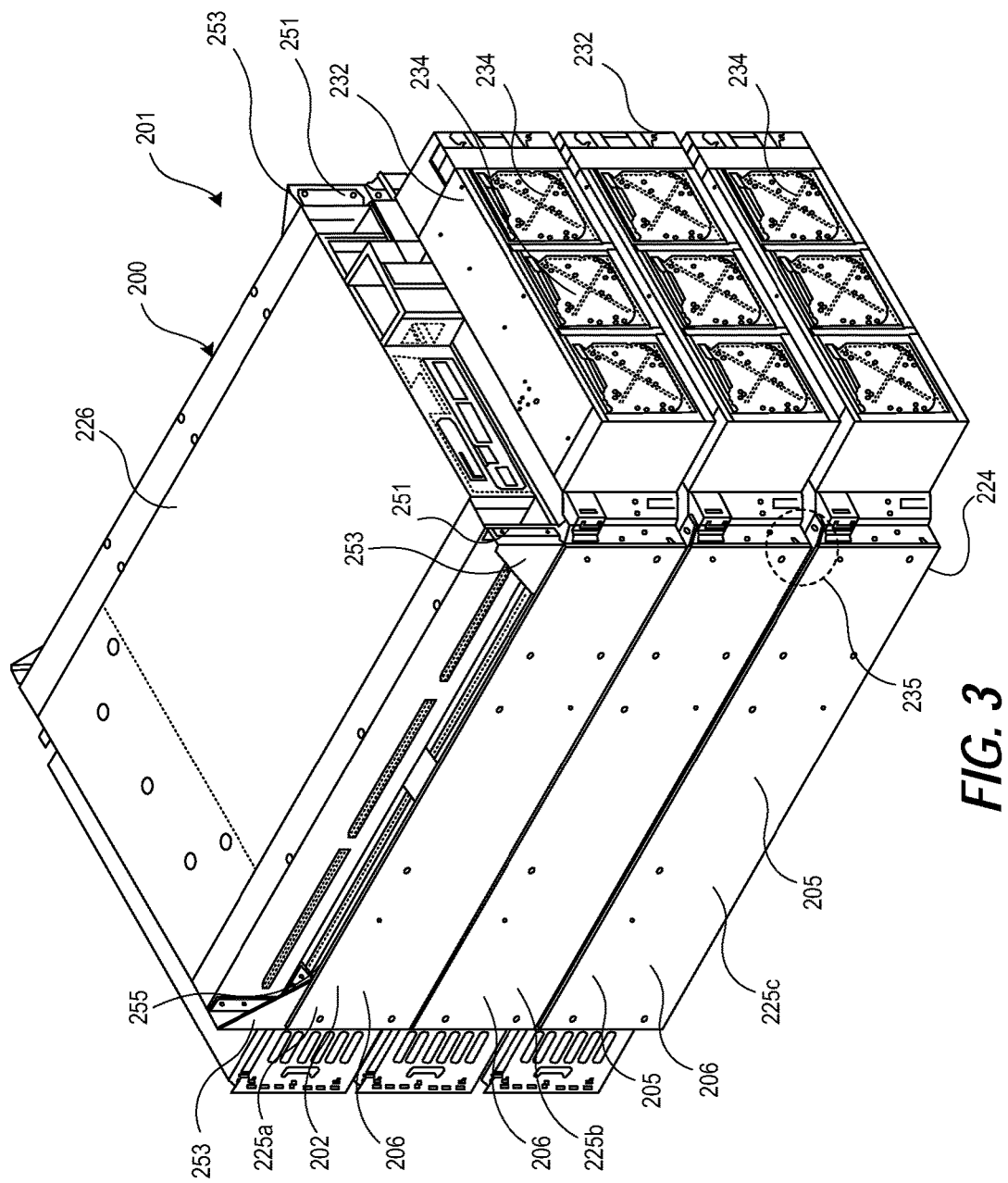
FIG. 3 illustrates an isometric rear view of an example rack apparatus, according to one embodiment.

FIG. 3 illustrates the rack apparatus 200 assembled as either an IHS 201 or as part of a larger rack system such as a MSE rack-based IHS 301 (FIG. 7), according to more than one embodiment. The rack apparatus 200 can be modular. A single IHS 201 can be configured from a desired number of blocks placed within the full rack chassis, which includes rack apparatus 200. The configuration of rack apparatus 200 is the same as FIG. 2, with one power bay chassis 226 and three block chassis 206. However, the rack apparatus 200 can include one, two, four or more block chassis 206. For ease of assembly and integration in one embodiment, support functions such as external communications, rack management, power and cooling control can be segregated in the power bay chassis 226 with sufficient capacity to support the number of block chassis 206. Each block 225 can have a fan bay module 232 containing fans 234 inserted therein.

Figure 4:
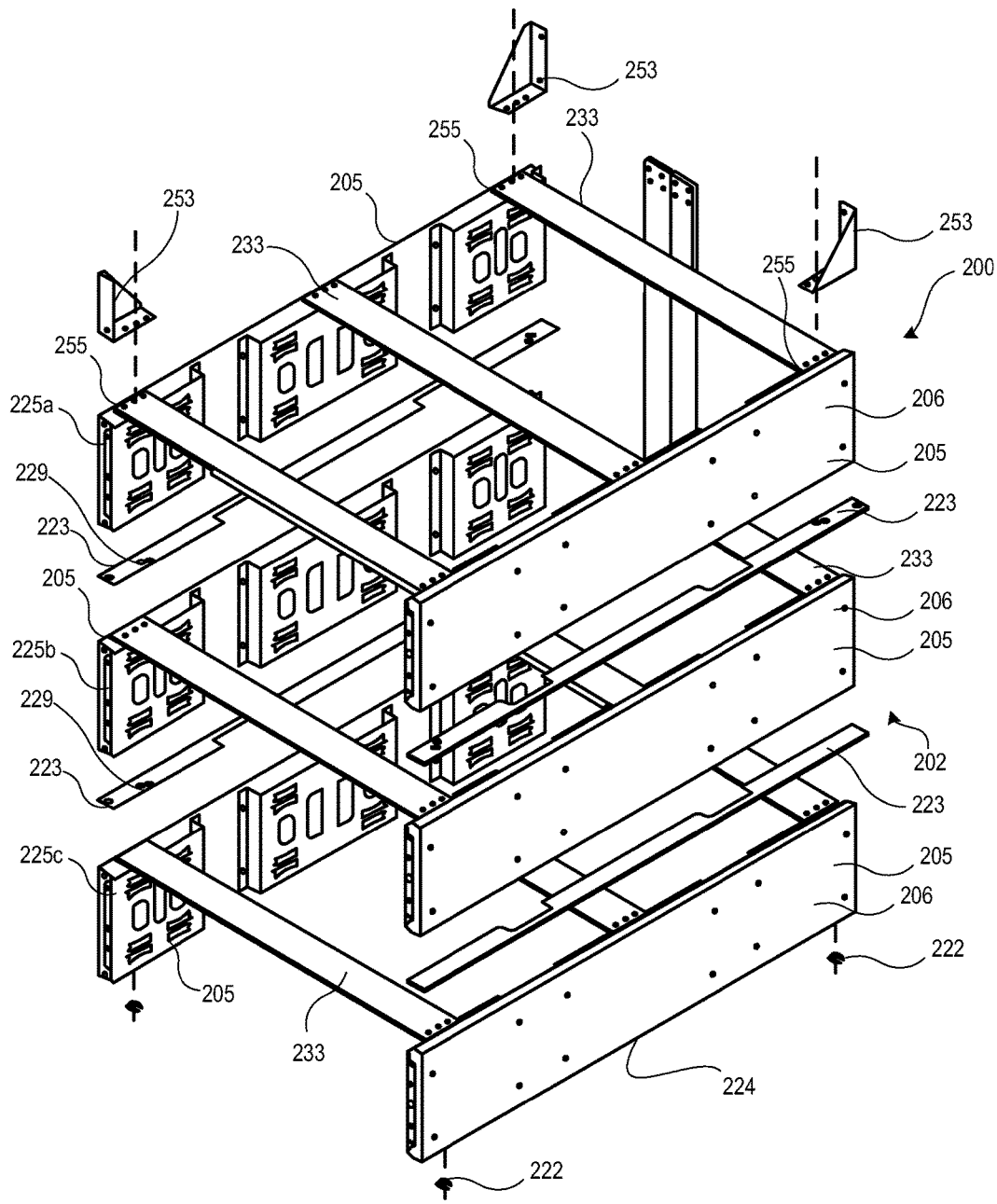
FIG. 4 illustrates an isometric, exploded view of a power bay chassis and a block chassis of the example rack apparatus of FIG. 3, according to one embodiment.

With reference to FIGS. 3-4, the frame or rack casing 202 of the rack apparatus 200 can be segmented into individual block side walls 205 for each block chassis 206. In FIG. 4, lateral support brackets 233 connect top edges of a pair of parallel side walls 205 of each block chassis 206. In the example rack apparatus 200, the top block 225a is attached to the underlying middle block 225b, which in turn is attached to the bottom block 225c. Physical supports at a bottom surface 224 of the frame or rack casing 202 are depicted as a rubber foot 222 bolted respectively underneath each end of the two pairs of block side walls 205. A top-of-rack (TOR) bracket 223 is attached along a top edge of each block side wall 205 of the middle block 225b and the bottom block 225c. A male key hole fastening component 229 projects upwardly from ends of each TOR bracket 223.

Figure 5:
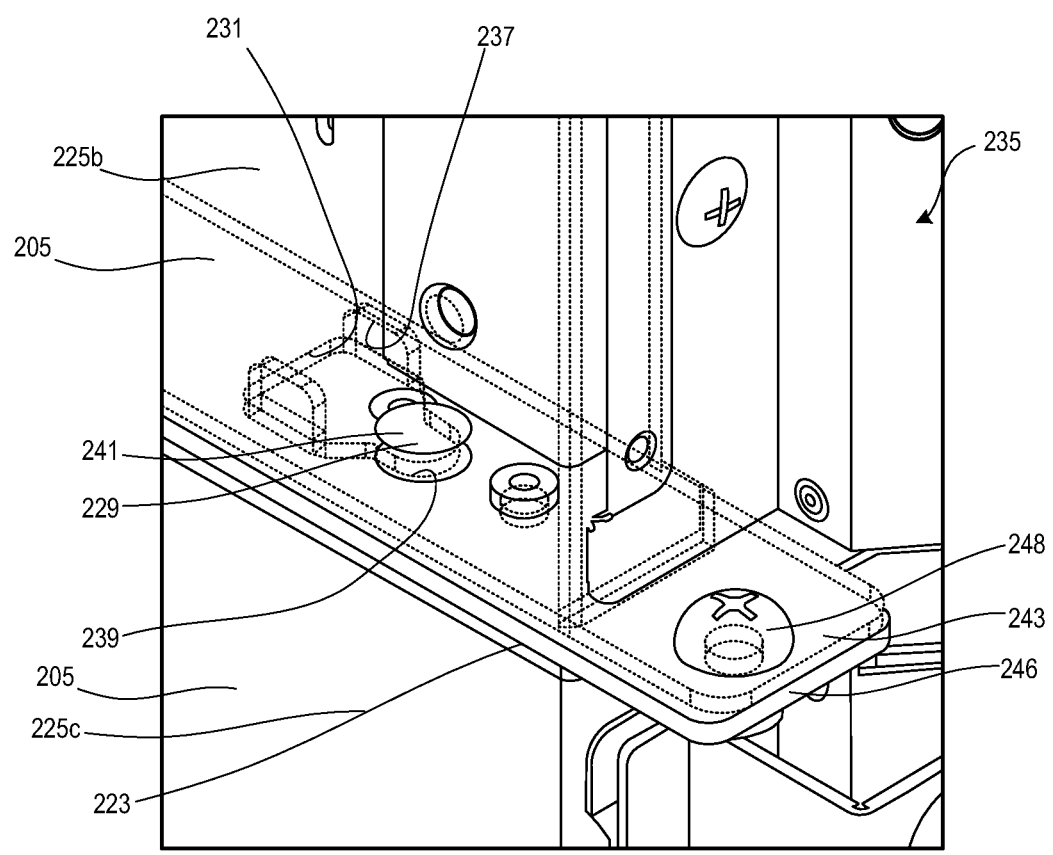
FIG. 5 illustrates an isometric, detail view of key hole fastener attachment between adjacent block chassis of FIG. 3, according to one embodiment.

In FIGS. 3 and 5, an attached corner 235 is formed between the middle block 225b and the bottom block 225c by engagement of the male key hole fastening component 229 with the proximate block side wall 205 of the middle block 225b. With particular reference to FIG. 5, the proximate block side wall 205 of the middle block 225b is depicted in phantom to reveal a female key hole fastening component 231 that engages the corresponding male key hole fastening component 229 of TOR bracket 223. The female key hole fastening component 231 includes an aperture 237 to receive the male key hole fastening component 229 from below. The aperture 237 communicates with a narrow channel 239 to closely engage beneath a flat cap 241 of the male key hole fastening component 231. A lateral tab 243 of the block side wall 205 extends outwardly over the top of an exposed end 246 of the corresponding TOR bracket 223 to be fastened thereto by a metal screw 248.

Figure 6:
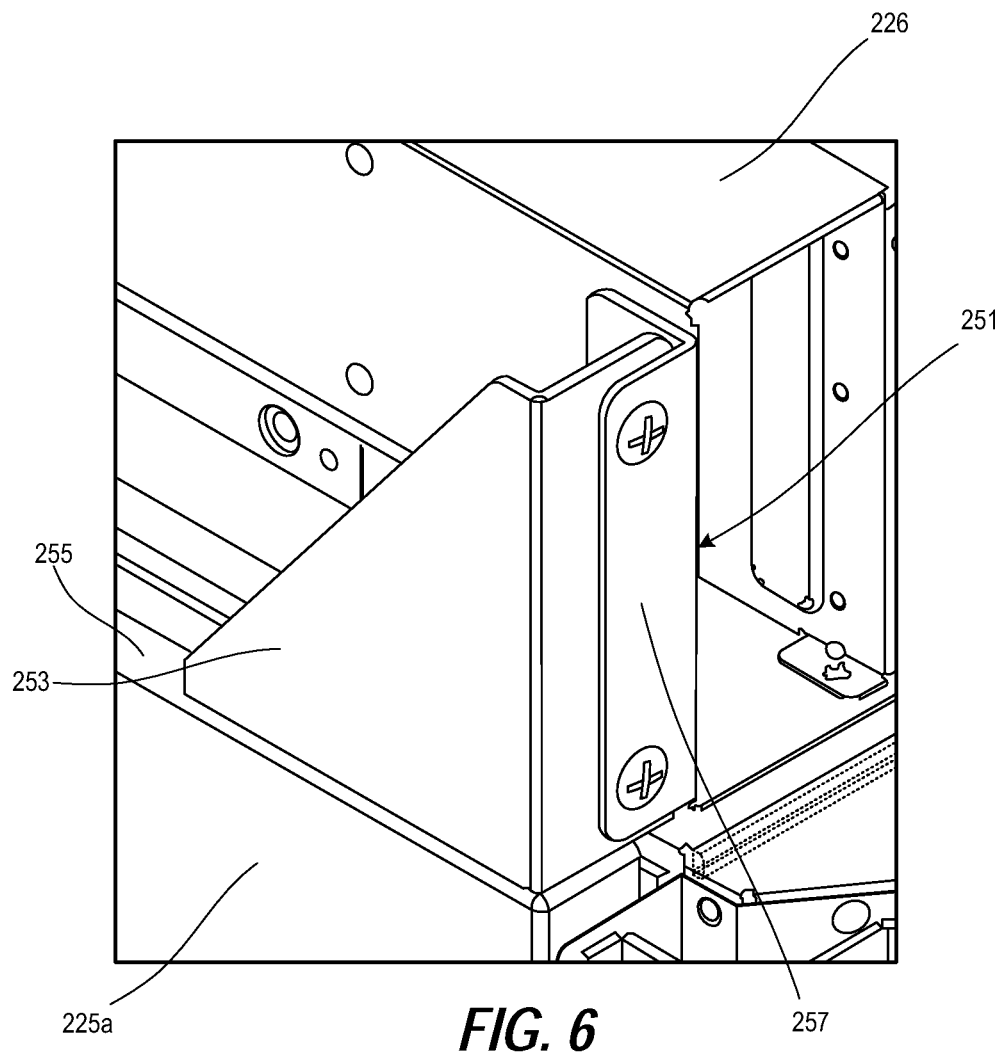
FIG. 6 illustrates an isometric, detail view of mount ear assemblies attaching a power bay chassis to a block chassis of FIG. 3, according to one embodiment.

With reference to FIGS. 3, 4 and 6, the power bay chassis 226 includes L-shaped power bay brackets 251 attached to extend a vertical surface 257 (FIG. 6) laterally from each corner. A set of mount ear assemblies 253 are attached to an upper surface 255 of the top block 225a. With particular reference to FIG. 6, a respective mount ear assembly 253 is aligned for vertical sliding engagement with a corresponding vertical surface 257 of the corresponding power bay bracket 251. A metal screw 259 fastens the respective mount ear assembly 253 to the corresponding power bay bracket 251.

FIG. 7 illustrates the rack apparatus 200 being used as an extension 700 of a larger rack system, depicted as a base IT rack 761, to form a MSE rack-based IHS 701. In at least one embodiment, the base IT rack 761 is sized for deployment through a doorway and the rack apparatus 200 is sized for placement upon the base IT rack 761. For example, IT components that require assembly and integration at an original equipment manufacturer (OEM) or similar facility can be deployed in the IT rack 761. Components that can be assembled after deployment can be later incorporated into the rack apparatus 200. In one aspect, the rack apparatus 200 can provide power distribution, cooling, rack management and cable management for the base IT rack 761. In one embodiment, the rack apparatus 200 can include blocks 225 with functional components that can expand the capabilities of the base IT rack 761. For example, a base IT rack 761 can have a framework height below a 7' (2125.6 mm) door height restriction with adequate clearance. The base IT rack 761 can be fully integrated with IT equipment and installed in its final deployment location. Then the rack apparatus 200 can serve as a secondary "Top Hat" framework that is installed on top of the base IT rack 761 to bring the MSE rack-based IHS 701 to its final height. In at least one embodiment, the "Top Hat" can contain all of the IT infrastructure (power distribution, cooling, rack management and cable management) that is easily integrated with the base IT rack 761. It is appreciated that power conductors, such as a modular busbar 714, and communication cables 736 extended between the extension 700 and the IT rack 761 to facilitate deployment and modular expansion. In one embodiment, the extension 700 can provide rack management and infrastructure control via the communication cables 736. For example, the power subsystem 228 and IM 227 and RMC 238 (FIG. 2) provided by the extension 700 can be connected to block controllers within the base IT rack 761 to provide rack-level control and communication.

Figure 8:
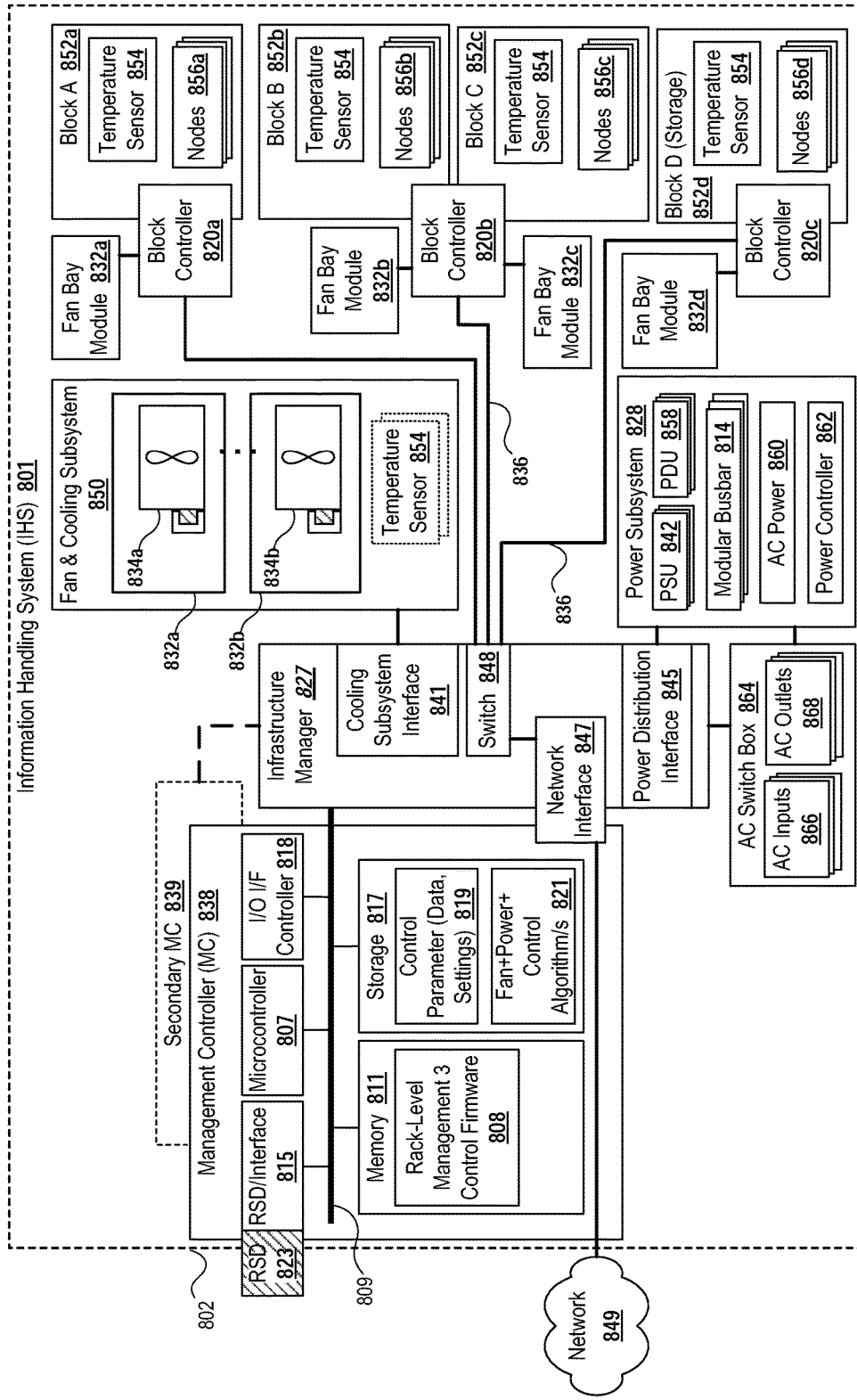
FIG. 8 illustrates a block diagram of an example IHS within which various aspects of the disclosure can be implemented, according to one or more embodiments.

FIG. 8 illustrates a block diagram representation of an example IHS 801, within which one or more of the described features of the various embodiments of the disclosure can be implemented. For example, the IHS 801 can be an example implementation of the IHS 101 (FIG. 1) or IHS 201 (FIG. 2). For purposes of this disclosure, an information handling system, such as IHS 801, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 8, there is illustrated a two-dimensional block diagram of an example rack-based IHS 801 configured as a modular, expandable rack with modular configuration of various functional components inserted therein. As a two-dimensional image, certain of the presented components are shown in different orientations relative to each other for simplicity in describing the connectively of the components. For example, while certain components are shown separate from a power subsystem 828, in actual implementation, these components can be located on or within several of the components of the power subsystem 828. Similarly, while the power subsystem 828 is shown with specific components within a single block, each of these components is not necessarily contained in a unitary structure. For example, a modular busbar 814 can be extended along the entire vertical run of the rack with only one sub-section in connection with the actual power bay. For purposes of the disclosure all general references to an information handling system shall refer to the rack-level IHS 801, while references to actual processing nodes within the IHS 801 shall be referenced as chassis level processing nodes or IT gear. It is further appreciated that within the rack-based IHS 801 can be implemented separate domains or systems that are independent of each other and can be assigned to different independent customers and/or users. However, this level of detail of the actual use of the processing nodes within the general rack-level IHS 801 is not relevant to the descriptions provided herein and are specifically omitted.

As presented in FIG. 8, IHS 801 includes a rack casing or frame 802, which can comprise one or more panels of sheet metal or other material interconnected to form a three dimensional volume generally referred to in the industry as a rack. Unique aspects of the rack casing or frame 802, which add to the modularity and expandability of IHS 801, are further illustrated and described in one or more of the three-dimensional figures presented herein. As is further presented by these three-dimensional figures, certain components indicated herein are located internal to the rack casing or frame 802 while other components can be located external to rack casing or frame 802. These various components are communicatively connected to one or more components via power and communication cables, which are generally represented by the connecting lines of FIG. 8. IHS 801 comprises a hierarchical arrangement of multiple management modules, along with power and cooling components, and functional processing components or IT gear within end nodes. At the rack level, IHS 801 includes a management controller (MC) 838 communicatively connected to infrastructure manager/module (IM) 827. MC 838 can also be referred to as a Rack Management Controller (RMC). MC 838 includes a microcontroller 807 (also generally referred to as a processor) which is coupled via an internal bus 809 to memory 811, I/O interface 818, removable storage device (RSD) interface 815 and storage 817. Memory 811 can be flash or other form of memory. Illustrated within memory 811 is rack-level power management and control (RPMC or PMC) firmware 808, which is inclusive of the firmware that controls the operation of MC 838 in communicating with and managing the down-stream components (i.e., blocks and processing nodes, etc.) of IHS 801. I/O interface 818 provides connection points and hardware and firmware components that allow for user interfacing with the MC 838 via one or more connected I/O devices, such as a keyboard, a mouse, and a monitor. I/O interface 818 enables a user to enter commands via, for example, a command line interface (CLI), and to view status information of IHS 801. I/O interface 818 also enables the setting of operating parameters for IHS 801, among other supported user inputs. RSD interface 815 enables insertion or connection of a RSD 823, such as a storage device (SD) card containing pre-programmable operating firmware for IHS 801. In at least one embodiment, a RSD 823 stores a copy of the operating parameters of IHS 801 and the RSD 823 can be utilized to reboot the IHS 801 to its operating state following a system failure or maintenance shutdown. Storage 817 can be any form of persistent storage and can include different types of data and operating parameters (settings) 819 utilized for functional operation of IHS 801. Among the stored content within storage 817 can also be algorithms 821 for fan and/or power and/or control. In one or more embodiments, IHS 801 can optionally include at least one other MC, illustrated as secondary MC 839, to provide a redundant configuration of MCs 838/839 which are both simultaneously active and functioning. With these embodiments, the redundant configuration enables IHS 801 to continue operating following a failure of either of the MCs 838/839 or in the event one of the MCs 838/839 has to be taken offline for maintenance.

Infrastructure manager 827 includes cooling subsystem interface 841, Ethernet switch 848, power distribution interface 845 and network interface 847. Network interface 847 enables IHS 801 and specifically the components within IHS 801 to connect to communicate with or via an external network 849.

In addition to the above described MC 838 and IM 827, IHS 801 further comprises a fan and cooling subsystem 850, power subsystem 828, and a plurality of processing blocks 852, individually labeled as blocks A-D 852*a*-852*d*. In one implementation, each block 852 has an associated block controller (BC) 820. Cooling subsystem 850 includes a plurality of fan modules, or merely "fans", of which a first fan 834*a* and a second fan 834*b* are shown. These fans 834*a*, 834*b* are located within a respective fan bay module 832 and can be different sizes and provide different numbers of fans 834 per fan bay module 832. One or more aspects of the modularity of the cooling subsystem and particularly the fan modules are presented within the descriptions which follow, with reference to one or more of the three-dimensional figures. Also included within cooling subsystem 850 is a plurality of temperature sensors 854, which are further shown distributed within or associated with specific blocks 852. Cooling subsystem 850 of IHS 801 further includes some design features of the rack casing or frame 802, such as perforations for air flow and other design features not expanded upon within the present description. As alluded to by the dashed boxes representing the individual fans 834*a*-834*b*, each fan 834*a*-834*b* is located behind (or in the air flow path of) a specific block 852 and the fan 834*a*-834*b* is communicatively coupled to and controlled by the block controller 820 associated with that block 852. Within each block 852 is at least one, and likely a plurality, of functional/processing nodes 856. As one aspect of the disclosure, the number of nodes that can be placed within each block and/or supported by a single block controller can vary up to a maximum number (e.g., 16) based on the block dimension relative to the size and configuration of each processing node. Additionally, as provided by block D 852*d*, one or more of the blocks can be utilized to provide rack-storage of storage devices. Also, as shown with blocks B 852*b* and C 852*c*, a single block controller 820*b* can be assigned to control multiple blocks 852*b*-852*c*, when the number of processing nodes 856 within an individual block does not exceed the pre-established block controller (BC) threshold. In at least one implementation, the BC threshold can be set to 16 nodes. Each node 856 controlled by a respective block controller 820 is communicatively coupled to block controller 820 via one or more cables.

Switch 848 enables MC 838 to communicate with block controllers 820 via a network of Ethernet cables 836. Specifically, according to at least one embodiment, MC 838 provides certain control and/or management signals to BCs 820 via one or more select wires within the Ethernet cables 836, which select wires are additional wires within the Ethernet cable that are not utilized for general system and network communication.

Power subsystem 828 generally includes a plurality of power supply units (PSUs) 842, one or more power distribution units (PDUs) 858, and a modular busbar 814. Power subsystem 828 also includes a source of external power (not shown), assumed to be AC power 860. Each of the individual nodes 856 and other components within the IHS 801 that require power are either directly coupled to modular busbar 814 or coupled via power cables to PDUs 858 to obtain power. As one aspect of power distribution within IHS 801, MC 838 can monitor power consumption across the IHS 801 as well as the amount of available power provided by the functional PSUs 842 and trigger changes in power consumption at the block level and ultimately at the (processing) node level based on changes in the amount of available power and other factors. Control of the power subsystem 828 can, in one embodiment, be provided by a separate power controller 862, separate from MC 838. As further illustrated, one additional aspect of the power system for the IHS 801 is the inclusion of AC switch box 864. AC switch box 864 is communicatively coupled to both IM 827 and power subsystem 828. AC switch box 864 includes a plurality of AC inputs 866 and a plurality of AC outlets 868 that are utilized to supply power to the PSUs 842, and other functional components of the IHS 801 that require AC power.

In an exemplary embodiment, components of the IHS 801 can be organized into a hierarchy as described in TABLE A:

TABLE A

| Level | Device/Module | Acronym | Comments |
| --- | --- | --- | --- |
| Domain Level | Management Controller | MC | In front of Power Bay |
| Domain Level | Infrastructure module | IM | In rear of Power Bay |
| Domain Level | AC Switch Box | ACSB | Behind network switches |
| Domain Level | Power Bay Power Module | PBPM | Connects to 10 supplies and two MCs. Designed by Delta |
| Domain Level | Power Bay | Power Bay | Holds PBPM, MCx2, IM, & ACSB |
| Block Level | Block Controller | BC | Hot plug Fan controller + Serial & node interface |
| Block Level | Block Controller | BCDB | Fixed in Block |

TABLE A-continued

| Level | Device/Module | Acronym | Comments |
| --- | --- | --- | --- |
| | Distribution Board | | |
| Block Level | Power Interface Board | PIB | Columns of 4 nodes |
| Block Level | Temperature Probe Board | TPB | Ambient Temperature Sensor |
| Node Level | Node Power Distribution Board | NPDB | In each node |
| Node Level | 4 drive HDD BP | x4HDDBP | Used in 12 drive FW HP sled |
| Node level | 2 drive HDD PB | x2HDDBP | Used for HP 2.5" in HW sled |

Those of ordinary skill in the art will appreciate that the hardware components and basic configuration depicted in the various figures (e.g. FIG. 1, 2 or 3, and others) and described herein may vary. For example, the illustrative components within IHS 801 (FIG. 8) are not intended to be exhaustive, but rather are representative to highlight components that can be utilized to implement various aspects of the present disclosure. For example, other devices/components/modules may be used in addition to or in place of the hardware and software modules depicted. The depicted examples do not convey or imply any architectural or other limitations with respect to the presently described embodiments and/or the general disclosure.

Figure 9:
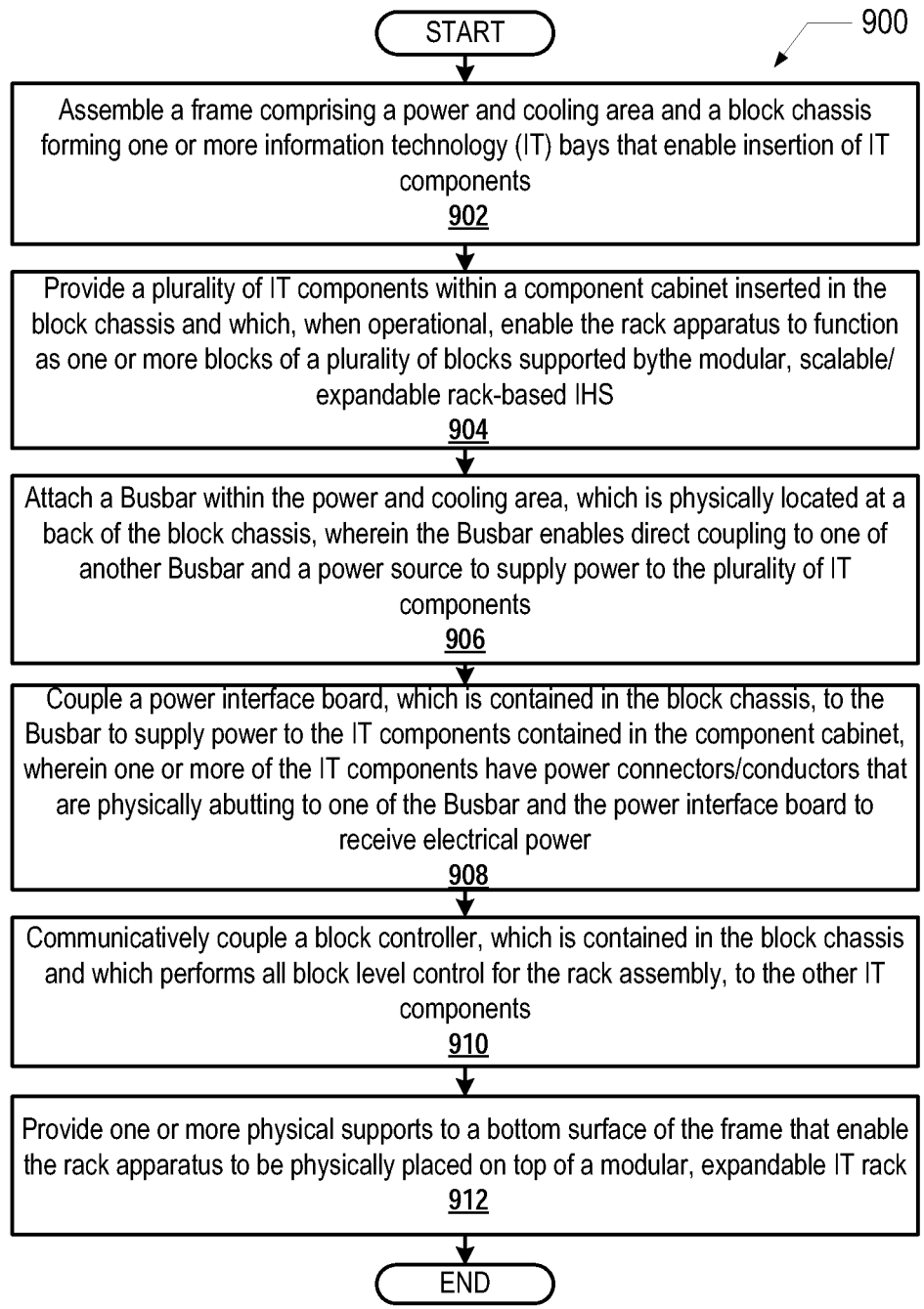
FIG. 9 illustrates a flow diagram of a method for implementing a rack assembly for an IHS, according to one embodiment.

FIG. 9 illustrates a method 900 for implementing a rack assembly for an IHS, according to one embodiment. In one aspect, the rack assembly can function as a physically attachable extension of a MSE rack-based IHS. At block 902, the method 900 includes assembling a frame including a power and cooling area and a block chassis forming one or more IT bays that enable insertion of IT components. In block 904, a plurality of IT components are provided within a component cabinet that is inserted in the block chassis. When operational, the plurality of IT components enable the rack apparatus to function as one or more blocks of a plurality of blocks supported by the MSE rack-based IHS. In block 906, the method 900 further includes attaching a busbar within the power and cooling area, which is physically located at a back of the block chassis. The busbar enables direct coupling to one of another busbar and a power source to supply power to the plurality of IT components. In block 908, a power interface board, which is contained in the block chassis, is coupled to the busbar to supply power to the IT components contained in the component cabinet. One or more of the IT components have power connectors/conductors that physically abut to one of the busbar and the power interface board to receive electrical power. At block 910, the method 900 includes communicatively coupling a block controller, which is contained in the block chassis and which performs all block level control for the rack assembly, to the other IT components of the associated block. One or more physical supports are attached to a bottom surface of the frame that enable the rack apparatus to be physically placed on top of a modular, expandable IT rack (block 912).

Figure 10:
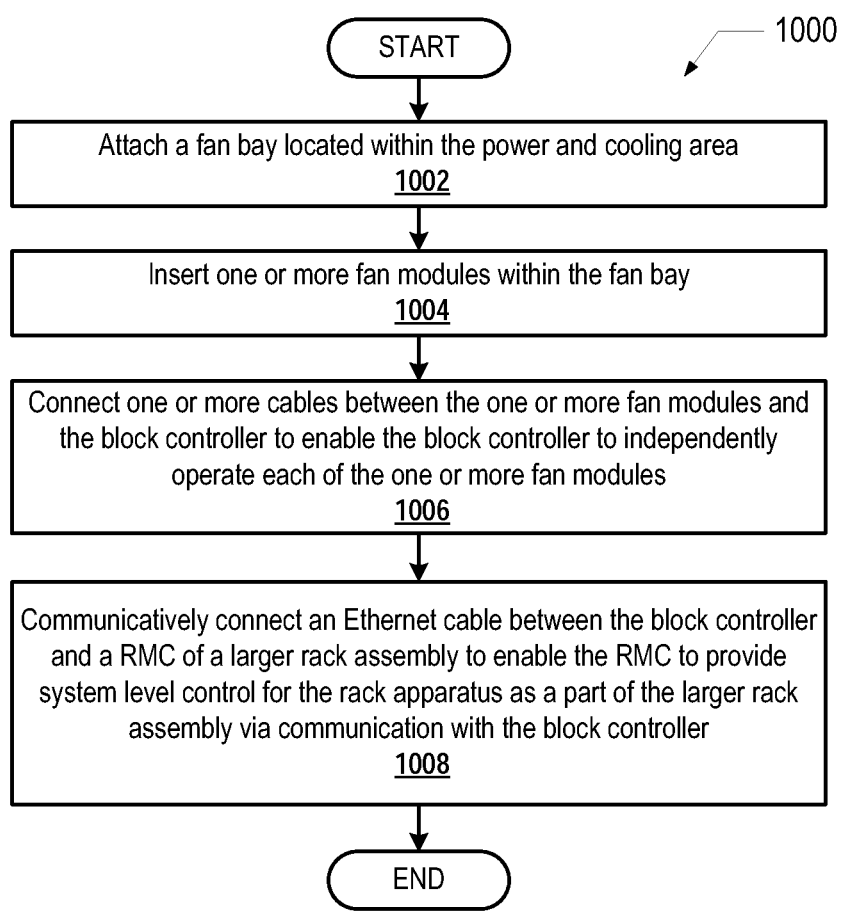
FIG. 10 illustrates a flow diagram of an example method for connecting the rack apparatus to a larger rack assembly, according to one embodiment.

FIG. 10 illustrates an example method 1000 for connecting the rack apparatus to a larger rack assembly, according to one embodiment. The method 1000 includes attaching a fan bay located within the power and cooling area. In block 1004, one or more fan modules are inserted within the fan bay. One or more cables are connected between the one or more fan modules and the block controller to enable the block controller to independently operate each of the one or more fan modules (block 1006). The method 1000 further includes communicatively connecting an Ethernet cable between the block controller and a RMC of a larger rack assembly. The connection of the Ethernet cable can enable the RMC to provide system level control for the rack apparatus as a part of the larger rack assembly via communication with the block controller in block 1008.

Figure 11:
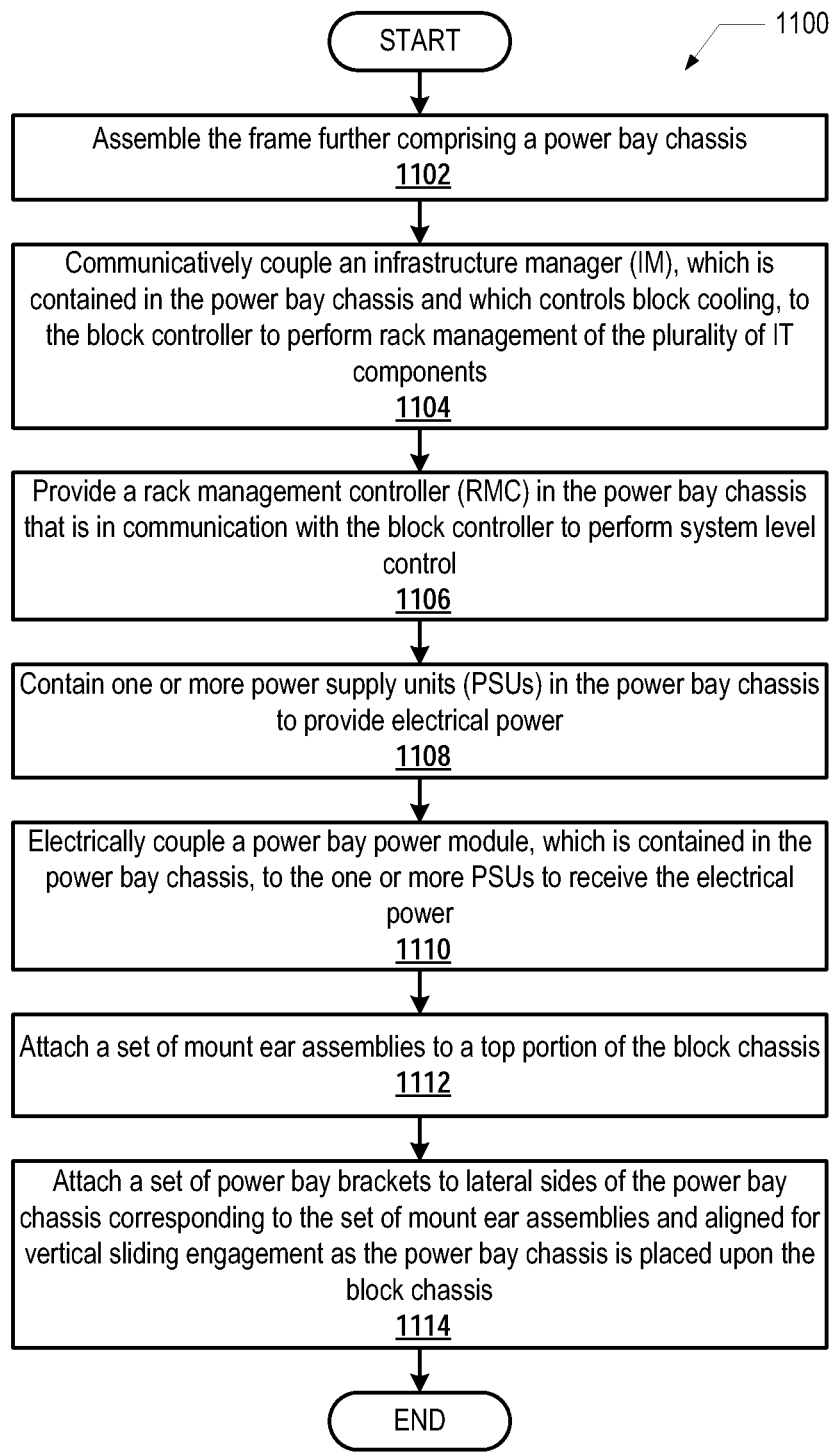
FIG. 11 illustrates a flow diagram of an example method for providing power and rack management to the rack assembly by a power bay chassis, according to one embodiment.

FIG. 11 illustrates an example method 1100 for providing power and rack management to the rack assembly by a power bay chassis, according to one embodiment. The method 1100 includes assembling the frame to include a power bay chassis (block 1102). In block 1104, an infrastructure manager (IM), which is contained in the power bay chassis and which controls block cooling, is communicatively coupled to the block controller to perform rack management of the plurality of IT components supported by that block controller. The method 1100 further includes providing a rack management controller (RMC) in the power bay chassis that is in communication with the block controller to perform system level control (block 1106). One or more power supply units (PSUs) are contained in the power bay chassis to provide electrical power (block 1108). In block 1110, a power bay power module, which is contained in the power bay chassis, is electrically coupled to the one or more PSUs to receive the electrical power. A set of mount ear assemblies is attached to a top portion of the block chassis in block 1112. A set of power bay brackets are attached to lateral sides of the power bay chassis corresponding to the set of mount ear assemblies and aligned for vertical sliding engagement as the power bay chassis is placed upon the block chassis (block 1114).

In the above described flow charts of FIGS. 9-11, one or more of the methods may be embodied in a computer readable device containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A rack apparatus, comprising:
a frame comprising (i) a power and cooling area and (ii) a block chassis forming one or more;
a plurality of Information Technology (IT) components contained within a component cabinet inserted in the block chassis and which, when operational, enable the rack apparatus to function independently as an information handling system (IHS);
a first busbar physically located at a back of the block chassis within the power and cooling area and which enables direct coupling to at least one of a second busbar and a power source to supply power to the plurality of IT components;
a power interface board contained in the block chassis and coupled to the first busbar to supply power to the IT components contained in the component cabinet;
a block controller contained in the block chassis and communicatively coupled to the plurality of IT components and which performs all block level control for the rack apparatus; and
one or more physical supports at a bottom surface of the frame that enable the rack apparatus to be physically placed on top of a modular, expandable IT rack.

2. The rack apparatus of claim 1, wherein one or more of the plurality of IT components have electrical power conductors that physically abut to one of the busbar and the power interface board to receive electrical power.

3. The rack apparatus of claim 1, further comprising:
a fan bay located within the power and cooling area;
one or more fan modules inserted within the fan bay; and
one or more cables that connect the one or more fan modules to the block controller to enable the block controller to independently operate each of the one or more fan modules.

4. The rack apparatus of claim 1, wherein the block controller includes an Ethernet jack that enables the block controller to be communicatively connected to a rack management controller (RMC) of a rack assembly via an Ethernet cable to enable the RMC to provide system level control for the rack apparatus via communication with the block controller when the rack apparatus is integrated as a part of the rack assembly, wherein the rack apparatus operates as an extension of a modular, expandable rack-based IHS.

5. The rack apparatus of claim 1, wherein: when the rack apparatus is included within a rack assembly, the plurality of IT components comprises at least one of storage device nodes and computing device nodes; and when the rack apparatus is a stand-alone system, the plurality of IT components comprise at least one computing device node.

6. The rack apparatus of claim 1, further comprising:
a power bay chassis;
an infrastructure manager (IM) contained in the power bay chassis and communicatively coupled to the block controller to perform rack management and enable cooling of the plurality of IT components; and
a rack management controller (RMC) contained in the power bay chassis and which is communicatively coupled to the block controller to perform control of the modular, expandable IT rack, when connected thereto;
one or more power supply units (PSUs) contained in the power bay chassis to provide electrical power; and
a power bay power module contained in the power bay chassis and electrically coupled to the busbar and the one or more PSUs to receive the electrical power.

7. The rack apparatus of claim 6, further comprising:
a set of mount ear assemblies attached to a top portion of the block chassis; and
a set of power bay brackets attached to lateral sides of the power bay chassis in a vertical position corresponding to each position of the set of mount ear assemblies and aligned for vertical engagement, wherein the power bay chassis is slid into a stacked position with the block chassis.

8. The rack apparatus of claim 6, wherein the frame further comprises a second block chassis attached to the block chassis and forming one or more other IT bays that enable insertion of other IT components, the rack apparatus further comprising:
a second plurality of IT components contained within a second component cabinet inserted in the second block chassis;
another busbar segment within the power and cooling area that enables direct coupling to one of the busbar and the power source to supply power to the second plurality of IT components and which is physically located at a back of the second block chassis; and a second power interface board contained in the second block chassis and coupled to the other busbar to supply power to the second plurality of IT components contained in the second component cabinet, wherein one or more of the second plurality of IT components have power connectors/conductors that are physically abutting to one of the other busbar segment and the second power interface board to receive electrical power.

9. The rack apparatus of claim 8, wherein the block chassis comprises one or more female key hole fastener components that are downwardly-presented and the second block chassis comprises one or more corresponding, male key hole fastener components that are upwardly presented, wherein the one or more downwardly-presented female key hole fastener components are aligned with and the one or more corresponding male key hole fastener components.

10. An information handling system (IHS), comprising:
a frame comprising (i) a power and cooling area and (ii) a block chassis forming one or more information technology (IT) bays;
a plurality of IT components contained within a component cabinet inserted in the block chassis and which, when operational, enable the IHS to function as an extension of a modular, expandable rack-based IHS;
a first busbar physically located at a back of the block chassis within the power and cooling area, and which is directly coupled to one of a second busbar and a power source to supply power to the plurality of IT components;
a power interface board contained in the block chassis and coupled to the first busbar to supply power to the plurality of IT components contained in the component cabinet;
a block controller contained in the block chassis and communicatively coupled to the plurality of IT components and which performs all block level control for the IHS; and
one or more physical supports at a bottom surface of the frame that enable the IHS to be physically placed on top of the modular, expandable IT rack.

11. The IHS of claim 10, wherein one or more of the plurality of IT components have electrical power conductors that physically abut to one of the busbar and the power interface board to receive electrical power.

12. The IHS of claim 10, further comprising:
a fan bay located within the power and cooling area;
one or more fan modules inserted within the fan bay; and
one or more cables that connect the one or more fan modules to the block controller to enable the block controller to independently operate each of the one or more fan modules.

13. The IHS of claim 10, wherein the block controller includes an Ethernet jack that enables the block controller to be communicatively connected to a rack management controller (RMC) of a rack assembly via an Ethernet cable to enable the RMC to provide system level control for the IHS via communication with the block controller when the IHS is integrated as a part of the rack assembly.

14. The IHS of claim 10, wherein: the plurality of IT components comprises at least one of storage device nodes and computing device nodes; and when the IHS is a stand-alone system, the plurality of IT components comprise at least one computing device node.

15. The IHS of claim 10, further comprising:
a power bay chassis;
an infrastructure manager (IM) contained in the power bay chassis and communicatively coupled to the block controller to perform rack management and cooling of the plurality of IT components;
a rack management controller (RMC) contained in the power bay chassis and which is communicatively coupled to the block controller to perform control of the modular, expandable IT rack;
one or more power supply units (PSUs) contained in the power bay chassis to provide electrical power; and
a power bay power module contained in the power bay chassis and electrically coupled to the one or more PSUs to receive the electrical power and electrically coupled to the busbar.

16. The IHS of claim 15, further comprising:
a set of mount ear assemblies attached to a top portion of the block chassis; and
a set of power bay brackets attached to lateral sides of the power bay chassis corresponding to the set of mount ear assemblies and aligned for vertical sliding engagement, wherein the power bay chassis is in a stacked position with the block chassis.

17. The IHS of claim 15, wherein the frame further comprises a second block chassis attached to the block chassis and forming one or more other IT bays that enable insertion of other IT components, the IHS further comprising:
a second plurality of IT components contained within a second component cabinet inserted in the second block chassis;
the other busbar within the power and cooling area that enables direct coupling to one of the busbar and the power source to supply power to the second plurality of IT components and which is physically located at a back of the second block chassis; and
a second power interface board contained in the second block chassis and coupled to the other busbar to supply power to the second plurality of IT components contained in the second component cabinet, wherein one or more of the second plurality of IT components have power connectors/conductors that are physically abutting to one of the other busbar and the other power interface board to receive electrical power.

18. The IHS of claim 17, wherein the block chassis comprises one or more female key hole fastener components and the second block chassis comprises one or more corresponding, male key hole fastener components, wherein the one or more downwardly-presented female key hole fastener components are aligned with and downwardly presented to receive by horizontally-translating engagement the one or more corresponding male key hole fastener components that are upwardly presented.

19. A method for providing a rack assembly to function as a physically attachable extension of a modular, scalable/expandable rack-based IHS, the method comprising:
assembling a frame comprising a power and cooling area and a block chassis forming one or more information technology (IT) bays;
providing a plurality of IT components within a component cabinet inserted in the block chassis and which, when operational, enable the rack apparatus to function as one or more blocks of a plurality of blocks supported by the modular, scalable/expandable rack-based IHS;
attaching a first busbar within the power and cooling area, which is physically located at a back of the block chassis, wherein the first busbar enables direct coupling to one of a second busbar and a power source to supply power to the plurality of IT components;

coupling a power interface board, which is contained in the block chassis, to the first busbar to supply power to the plurality of IT components contained in the component cabinet, wherein one or more of the plurality IT components have power connectors/conductors that are physically abutting to one of the busbar and the power interface board to receive electrical power;

communicatively coupling a block controller, which is contained in the block chassis and which performs all block level control for the rack assembly, to the plurality of IT components; and providing one or more physical supports to a bottom surface of the frame that enable the rack apparatus to be physically placed on top of a modular, expandable IT rack.

20. The method of claim 19, further comprising:
attaching a fan bay located within the power and cooling area;
inserting one or more fan modules within the fan bay; and
connecting one or more cables between the one or more fan modules and the block controller to enable the block controller to independently operate each of the one or more fan modules.

21. The method of claim 19, wherein:
when the rack apparatus is a stand-alone system, providing the plurality of IT components comprise providing at least one computing device node; and
when the rack apparatus is to be integrated as a part of modular, scalable/expandable rack:
  providing the plurality of IT components comprise providing at least one of storage device nodes and computing device nodes; and
  the method further comprises communicatively connecting an Ethernet cable between the block controller and a rack management controller (RMC) of the modular, scalable/expandable rack-based IHS to enable the RMC to provide control for the rack apparatus as a part of the rack-based IHS via communication with the block controller.

22. The method of claim 21, further comprising:
assembling the frame further comprising providing a power bay chassis;
communicatively coupling an infrastructure manager (IM), which is contained in the power bay chassis and which controls block cooling, to the block controller to perform rack management of the plurality of IT components;
providing a rack management controller (RMC) in the power bay chassis that is in communication with the block controller to perform system level control;
providing one or more power supply units (PSUs) in the power bay chassis to provide electrical power; and
electrically coupling a power bay power module, which is contained in the power bay chassis, to the one or more PSUs to receive the electrical power.

23. The method of claim 22, further comprising:
attaching a set of mount ear assemblies to a top portion of the block chassis; and
attaching a set of power bay brackets to lateral sides of the power bay chassis at locations corresponding to opposing locations of the set of mount ear assemblies and aligned for vertical engagement as the power bay chassis is placed upon the block chassis.

24. The method of claim 19, further comprising:
forming in the block chassis one or more downwardly-presented female key hole fastener components; and
forming in a second block chassis one or more corresponding, upwardly presented male key hole fastener components, wherein the one or more downwardly-presented female key hole fastener components are aligned to receive the one or more corresponding, upwardly presented male key hole fastener components.

* * * * *